(12) United States Patent
Orozco

(10) Patent No.: US 10,693,452 B2
(45) Date of Patent: Jun. 23, 2020

(54) ULTRA LOW EMISSION SOLID STATE RELAY

(71) Applicant: SENSATA TECHNOLOGIES, INC., Attleboro, MA (US)

(72) Inventor: Sergio Orozco, Tuuana (MX)

(73) Assignee: Sensata Technologies, Inc., Attleboro, MA (US)

(*) Notice: Subject to any disclaimer, the term of this patent is extended or adjusted under 35 U.S.C. 154(b) by 0 days.

(21) Appl. No.: 16/101,912

(22) Filed: Aug. 13, 2018

(65) Prior Publication Data
US 2020/0052688 A1  Feb. 13, 2020

(51) Int. Cl.
| | |
|---|---|
| H03K 17/16 | (2006.01) |
| H03K 17/687 | (2006.01) |
| H03K 17/13 | (2006.01) |
| H03K 17/785 | (2006.01) |
| H01H 47/02 | (2006.01) |
| H03K 17/76 | (2006.01) |
| H03K 17/725 | (2006.01) |

(52) U.S. Cl.
CPC ......... *H03K 17/161* (2013.01); *H03K 17/133* (2013.01); *H03K 17/6871* (2013.01); *H03K 17/785* (2013.01); *H01H 47/02* (2013.01); *H03K 17/725* (2013.01); *H03K 17/76* (2013.01); *H03K 2217/0009* (2013.01)

(58) Field of Classification Search
CPC ............... H03K 17/161; H03K 17/133; H03K 17/6871; H03K 17/785; H03K 17/725; H03K 2217/0009; H03K 17/76; H01H 47/02

USPC ......................................................... 327/109
See application file for complete search history.

(56) References Cited

U.S. PATENT DOCUMENTS

| | | | |
|---|---|---|---|
| 3,812,382 A * | 5/1974 | Pascente | H03K 17/136 361/167 |
| 5,155,289 A | 10/1992 | Bowles | |
| 6,486,485 B1 * | 11/2002 | Uekawa | H01L 31/12 250/216 |
| 6,583,997 B1 | 6/2003 | Reid et al. | |
| 6,603,221 B1 | 8/2003 | Liu | |
| 7,719,810 B2 | 5/2010 | Ueda | |
| 8,461,881 B2 | 6/2013 | Park | |
| 9,564,891 B1 * | 2/2017 | Bixby | H03K 17/136 |
| 9,788,391 B1 * | 10/2017 | Redfield | H05B 33/089 |
| 9,991,075 B2 | 6/2018 | Lenig et al. | |
| 2005/0073789 A1 | 4/2005 | Tanis | |
| 2009/0027824 A1 | 1/2009 | Allen et al. | |

(Continued)

*Primary Examiner* — Ryan Jager

(57) ABSTRACT

According to one embodiment, a solid state relay with ultra low emissions is disclosed. The solid state relay includes one or more inputs for receiving a control signal, an input circuit for processing the received control signal. An output circuit responsive to the control signal to close the solid state relay so that power may be delivered from a power source to an electrical load. The input circuit can include zero-crossing functionality configured such that the solid state relay does not turn on until an AC source signal crosses from a negative value to a positive value or from a positive value to a negative value. The zero crossing functionality may comprise opto-couplers with zero crossing functionality. The input circuit may further comprise a low emission driver portion that is to reduce emissions during the portion after the initial start up.

12 Claims, 6 Drawing Sheets

(56) References Cited

U.S. PATENT DOCUMENTS

| | | | |
|---|---|---|---|
| 2011/0046811 A1* | 2/2011 | Park | G05D 23/22 |
| | | | 700/300 |
| 2011/0102052 A1* | 5/2011 | Billingsley | H01H 9/542 |
| | | | 327/365 |
| 2011/0182094 A1* | 7/2011 | Lumsden | G01R 21/00 |
| | | | 363/126 |
| 2014/0132246 A1 | 5/2014 | Schwind | |
| 2017/0104326 A1* | 4/2017 | Vaziri | H02H 3/165 |

* cited by examiner

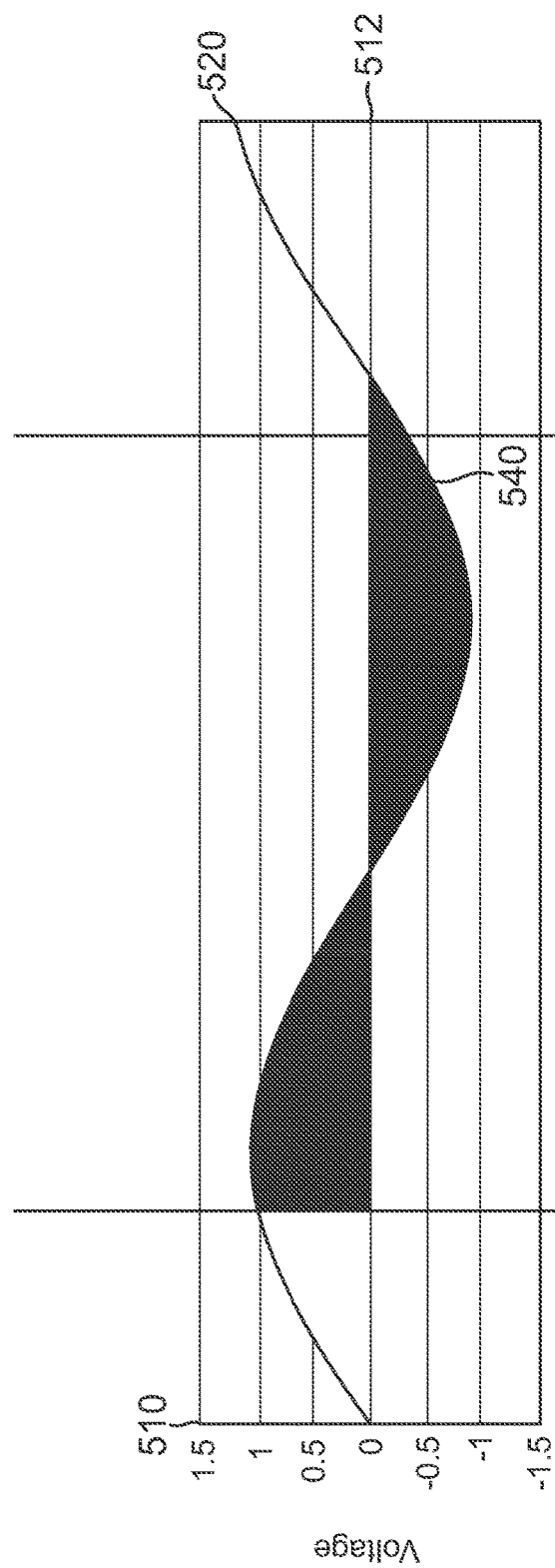
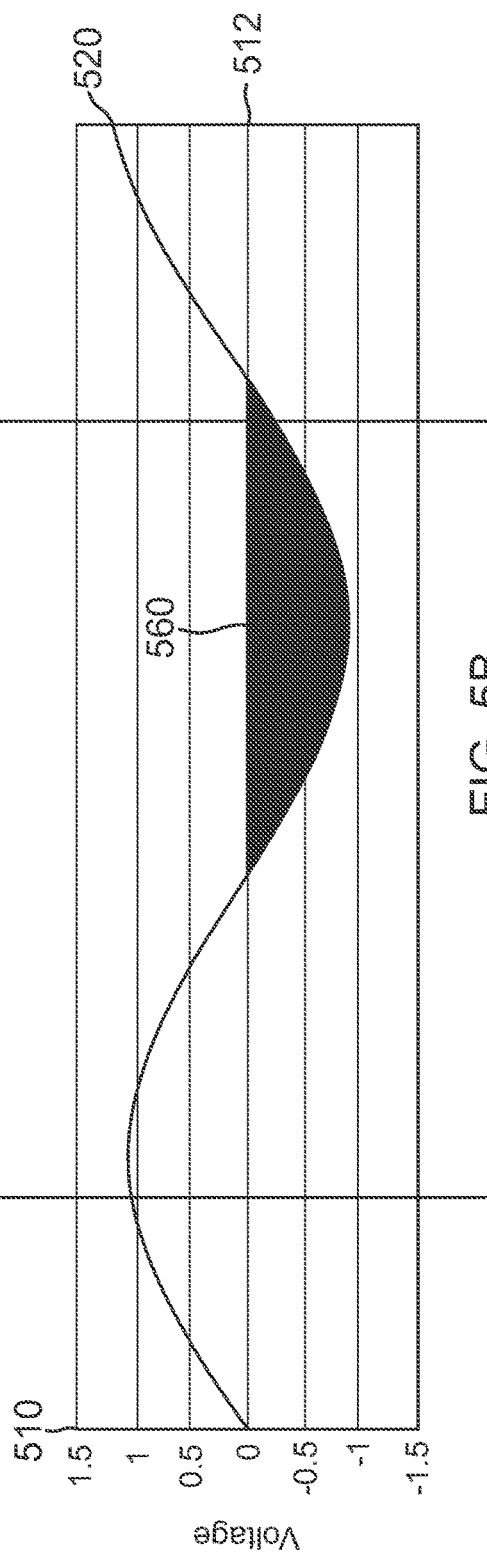

ULTRA LOW EMISSION SOLID STATE RELAY

FIELD OF THE INVENTION

The present disclosure relates to electronic circuits. More particularly, this disclosure relates to solid state relays with an ultra low emission.

BACKGROUND OF THE INVENTION

There are various known methods to switch electrical signals on and off. There is a mechanical switch, such as a light switch, in which a device is manually operated to connect or disconnect electricity from a source to a load. There are relays, which are electrically operated switches, such as those that use electromagnets, coils, springs, or mechanical contacts to mechanically operate a switch.

A solid state relay is an electronic switching device with no moving parts that relies on the electrical and optical properties of solid state semiconductors to perform switching functions. A typical solid state relay switches on and off when a small control voltage is applied to its control terminals. A solid state relay may be used to control alternating current (AC) or a direct current (DC) provided to a load. Furthermore, solid state relays offer greater performance and/or reliability than electromechanical switches or relays. In many cases, integrated-circuit based switches, such as silicon controlled rectifiers, TRIACs, gate turn-off thyristors, power transistors, and the like may be used as output switches within the solid state relay. In many cases, these IC-based switches may be controlled from an external control circuit, where the control signal may be isolated from the switch circuit by use of an optocoupler, a transformer, or other such optical device. This isolation may be used to reduce conducted electrical emissions from being introduced into the low-voltage DC control circuitry. However, due to the nature of semiconductor-based devices, (e.g., turn-on voltages, threshold voltages, etc.), the solid state switches may cause transient disturbances on an AC supply line. The transient disturbances may cause radio frequency (RF) disturbances that may be introduced onto the AC supply line (e.g., conducted emissions). In turn, these may interfere with the operation of other equipment using the same AC supply line.

To minimize the effect of the conducted emissions, one could install external filters. However, installing external filters may increase the size and/or cost of the equipment into which the solid state relay is installed.

SUMMARY OF THE INVENTION

According to one embodiment, a solid state relay with ultra low emissions is disclosed. The solid state relay includes one or more inputs for receiving a control signal, an input circuit for processing the received control signal. An output circuit responsive to the control signal to close the solid state relay so that power may be delivered from a power source to an electrical load. The input circuit can include zero-crossing functionality configured such that the solid state relay does not turn on until an AC source signal crosses from a negative value to a positive value or from a positive value to a negative value. The zero crossing functionality may comprise opto-couplers with zero crossing functionality. The input circuit may further comprise a low emission driver portion that is to reduce emissions during the portion after the initial start-up.

In another embodiment, a system for controlling power delivery to a load from an alternating current source is disclosed. The system includes a solid state switch comprising a plurality of inputs electrically coupled to a control circuit. In the embodiment, the control circuit provides a command to trigger the solid state switch to close. The system also includes a plurality of outputs electrically coupled between a power source and a load, and coupled to the plurality of inputs. The command to trigger the solid state switch to close results in power delivery from the power source to the load. In this embodiment, the solid state switch is configured to close after a first zero crossing after receiving the command to trigger the solid state switch to close.

The foregoing and other objects, features, and advantages of the invention will be apparent from the following more particular descriptions of exemplary embodiments of the invention as illustrated in the accompanying drawings wherein like reference numbers generally represent like parts of exemplary embodiments of the invention.

BRIEF DESCRIPTION OF THE DRAWINGS

So that those having ordinary skill in the art to which the disclosed technology appertains will more readily understand how to make and use the same, reference may be had to the following drawings.

FIGS. 5A and 5B depict graphs illustrating the timing of a turn on of a solid state switch illustrating the operating of zero crossing sensing features according to aspects of the disclosure.

DETAILED DESCRIPTION

The present disclosure describes a solid state relay with reduces conductive emissions and zero-crossing sensing.

Figure 1:
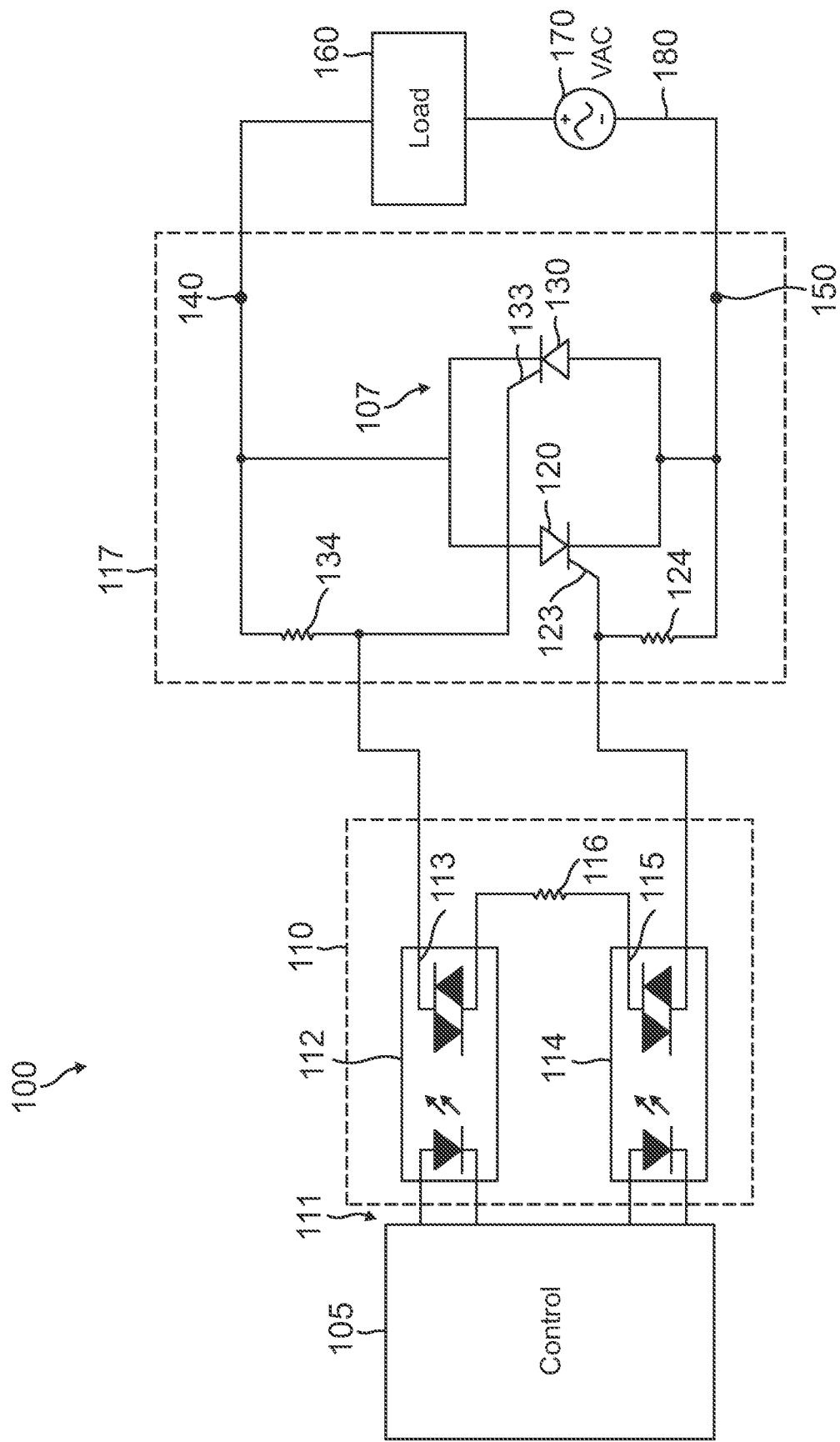
FIG. 1 shows an illustrative circuit diagram of a solid state switch using optocouplers to isolate the control line from the output switching devices of the solid state switch.

FIG. 1 shows an illustrative block diagram of a solid state switch (e.g., a solid state relay 100, a solid state contactor, etc.) having a configuration that reflects the current products used in industry. The solid state relay 100 may be controlled by a control circuit 105 that may be electrically connected to the solid state relay 100 via one or more input terminals 111. The control circuit 105 may be used to control the operation of the solid state relay 100 to cause an output switch circuit 117 to enable a desired output (e.g., a desired voltage, a desired current, etc.) to be provided from a power source 170 to a load 160 via output terminals 140, 150.

In an illustrative example, the solid state relay 100 may include an input circuit 110 and an output switch circuit 117. The input circuit 110 may include an optoisolator and/or an optocoupler circuit comprising one or more devices (e.g., an optocoupler 112, an optocoupler 114, a resistor 116, etc.) that may be used to provide an optically isolated trigger signal to the output circuit 117. In some cases, the input circuit 110 may be configured to provide a gating signal to a gate 123 of a first semiconductor switch and a gate 133 of a second semiconductor switch, such as the silicon controlled rectifiers (SCRs) SCR 120 and SCR 130, respectively. In some cases, different semiconductor switches may be used, such as gate turn-off thyristors (GTOs), triodes for alternating current (TRIACs), insulated gate bipolar transistors (IGBTs), and/or the like. The input circuit 110 may include a resistor 116 in series with the optocoupler 112 and the optocoupler 114. Resistor 116 may be used to limit inrush gate current to SCRs 120 and 130. In typical usage, optocouplers 112, and 114 are activated simultaneously, either both on or both off. This is because they have limited breakdown voltage. For example, in the case of a 480 volt alternating current, SCRs 120 and 130 have breakdown voltages of 1200 peak voltage (Vpk), while optocouplers 112 and 114 only have 600 Vpk each. The solid state relay 100 may be electrically coupled to the control circuit 105 via two or more input terminals 111 of the solid state relay. In some cases, the control circuit 105 may be used to generate one or more control signals to cause the solid state switch to selectively open and close.

With continuing reference to FIG. 1, the semiconductor switches of the output switch circuit 117 (e.g., SCR 120 and SCR 130) may be triggered into a conduction state by a current flowing through resistor 124 and/or the resistor 134, the output TRIACs of the optocoupler 112 and the optocoupler 114 (e.g., the TRIAC 113 and the TRIAC 115) and the gate of the relevant SCR, 120 or 130. As can be seen, the SCR 120 and the SCR 130 are configured in a back-to-back configuration and may be triggered into a conduction state by enabling TRIAC 113 of optocoupler 112 and TRIAC 115 of optocoupler 115 via one or more control signal received from the control circuit 105. When enabled, the forward voltage drop of each of the optocouplers 112, 114 is about 1.0 volt, at low current levels, resulting in about a 2 volt level being present before the associated SCR 120 or SCR 130 is activated. Further, each of the SCR 120 and the SCR 130 has a reverse voltage characteristic between the gate and cathode along with a gate-to-cathode threshold voltage of the particular SCR, in parallel with the voltage drop of across R124 and R134, to be turned on. Thus, before each of the SCR 120 and the SCR 130 is enabled, the voltage at output terminals 140 and 150 of the solid state switch may be within a range near 3.75 volts (e.g., from about 3.5 volts to about 4.0 volts, etc.). However, when the SCR 120 and the SCR 130 of the switch circuit 107 are activated, the voltage at the output terminals 140, 150 may drop to near 0.9 volts. In other words, when the SCR 120 and the SCR 130 are enabled ("switched on") in response to a control signal provided by the control circuit 105, the voltage level at the output terminals 140, 150 may experience a step change of about 3.0 volts. This step change further results in a step increase in load voltage and, accordingly, the load current.

Such transient changes in voltage and/or current may result in an electrical disturbance being conducted on the power lines 180. Such transient changes to the voltage and/or current signal may also result in conducted emissions being introduced onto the power lines over a range of frequencies (e.g., about 150 KHz to about 500 KHz, up to 30 MHz, etc.). In many cases, one or more industry or governmental standards may cover such a situation. For example, such industry and/or governmental standards may include the European Standard EN 55014-1, also known as CISPR 14-1, the Federal Communication Commission (FCC) standard FCC part 15B, and the like, which are included herein in their entirety by reference, to at least define allowable conducted emission levels at different power levels and/or allowable conducted emission levels based on specified devices or applications. These standards may be introduced in a jurisdiction to limit such conducted emissions to be within an allowable range to minimize any detrimental effect caused by the conducted emissions on other devices that may be sharing the same power lines 180. In current applications, a user of solid state switches may be forced to install expensive filters to reduce any introduced conducted emissions to be within allowable levels. For example, the standard CISPR 14-1 may include one or more sections regarding electromagnetic compatibility, such as for defining acceptable limits on conducted emissions within a range of frequencies, such as limiting an allowable amount of conducted emissions at a main power connection and at a load power connection. By limiting the allowable amount of conducted emissions that may be conducted back onto the main power lines (e.g., incoming), other devices that share the same power line may experience less performance degradation due to the amount of conducted emissions and/or may experience a longer life-span. In an illustrative example, a household appliance may include a solid state relay used to control the operation of a motor (e.g., turn the motor on and/or off). In many cases, one or more of the industry or governmental standard may include a section defining acceptable limits of conducted emissions that may be introduced to a power line (e.g., a mains power line, a load power line, etc.). In some cases, the AC power source may comprise a power source capable of providing a single phase AC voltage or a three phase AC voltage. The AC voltage that may be provided from the power source may range from about 110 Volts AC to about 600 Volts AC at either 50 Hz or 60 Hz.

Further, the amount of conducted emissions (e.g., an average level and/or a quasi-peak level) that may be allowable (e.g., from about 56 dBµV to about 66 dBµV, etc.) within the one or more power ranges (e.g., between about 150 KHz and about 500 KHz, between about 500 KHz and about 5 MHz, between about 5 MHz and about 30 MHz), where the amount of allowable conducted emissions may vary by the power level of a load (e.g., a rated motor power not exceeding about 700 watts, a rated motor power above 700 watts and not exceeding 1 kilowatt, a rated motor power greater than 1 kW, etc.), the location of where emissions may be measured (e.g., at the mains terminals, at load terminals, etc.) and/or by a type of equipment (e.g., vacuum cleaners, household appliances and similar equipment, tools, equipment classified as class A group 2 equipment, equipment classified as class B group 2 equipment, and/or the like). To meet these emissions levels a manufacturer and/or user may install expensive filters or other equipment to minimize the amount of conducted emissions produced by an installed device. In some cases, the filters installed by a user may increase the required space necessary to install the desired components, thus further increasing space requirements and costs associated with meeting these increased space requirements. For example, a user may need to purchase a larger than necessary enclosure to be able to install a required filter. In many cases, even a small step change in voltage and/or current may introduce conducted emissions that may meet or exceed the allowable limits set forth in the applicable standards.

In typical applications, solid state switches, such as the solid state relay 100, may be electrically isolated so as to not introduce noise (e.g., conducted emissions) into a lower power control circuit, particularly in relation to the output circuit. For example, a solid state switch may be configured to receive a control signal in the range of about 3 VDC to about 32 VDC, from about 18 VAC to about 36 VAC, and/or from about 90 VAC to about 280 VAC. In many cases, an input current drawn by the solid state switch may be minimized, for example, within a range of about 2 mA to about 4 mA. In such cases, the input switch circuit 110 may include an optically-coupled, low-power transistor, or other such low power semiconductor switching device, to provide a turn-on voltage at the gate of the SCRs 120, 130 of the output switch circuit 107.

However, as discussed above, many jurisdictions (e.g., Europe, the United States, Canada, etc.) may have enacted standards to minimize an effect that an installed electrical device may have on the connected power system. For example, one or more standards may require that equipment powered by shared power lines do not transmit emissions back onto the supply line and/or the load lines. As discussed above, the semiconductor threshold voltages of the optocouplers, or other low level switching devices, when combined with the threshold voltage of the SCR may cause a voltage level (e.g., about 5 volts, etc.) to be present at the output terminals of the solid state switch. Once the devices of the output switch circuit 107 are triggered, the voltage level at the output terminals 140, 150 of the solid state relay may fall to about 1 volt. This nearly instantaneous drop in voltage may cause a corresponding transient step up in current on the supply line, which, while small, may be large enough to generate conducted emissions on the supply line and/or the load lines within the regulated frequency range(s). Such step responses in voltage and/or currents are composed of signals over a wide range of frequencies. For example, a step increase may include one or more conducted emissions components within a range from about 150 kHz to about 500 kHz. Such transient step increases may also include emission components at higher frequencies, such as within the range to about 30 MHz This step response may be nearly eliminated, or at least minimized, by replacing the low power switching devices (e.g., the TRIACs 113 and 115 of the optocouplers 112 and 114) with high power field effect transistors (FETs), such as power metal-oxide-semiconductor field-effect transistors (MOSFETs) due to the characteristics of the power FET devices. For example, when a power MOSFET is active, the characteristics of the device cause the MOSFET to act similarly to a resistor. In other words, the operating mode for the MOSFET device may result in a near constant current, which corresponds to a nearly stable equivalent resistance (e.g., R.sub.DS(ON)). Another advantage of MOSFETs is that these devices require very little current to turn on (e.g., less than about 1 mA) while having a much higher output rating (e.g., about 10 A, about 50 A, etc.). MOSFETs may be n-channel or a p-channel. In some cases, such as for n-channel MOSFETS, the gate may be biased positive relative to the source biasing. If a signal is applied to a power MOSFET, a series resistance characteristic of the MOSFET may be the same regardless of a direction of the current. In the illustrative example of FIGS. 2 and 3, the MOSFET devices are shown in series opposition arrangement, where both of the MOSFET devices are of the same type (e.g., both are n-channel, both are p-channel, etc.).

Figure 2:
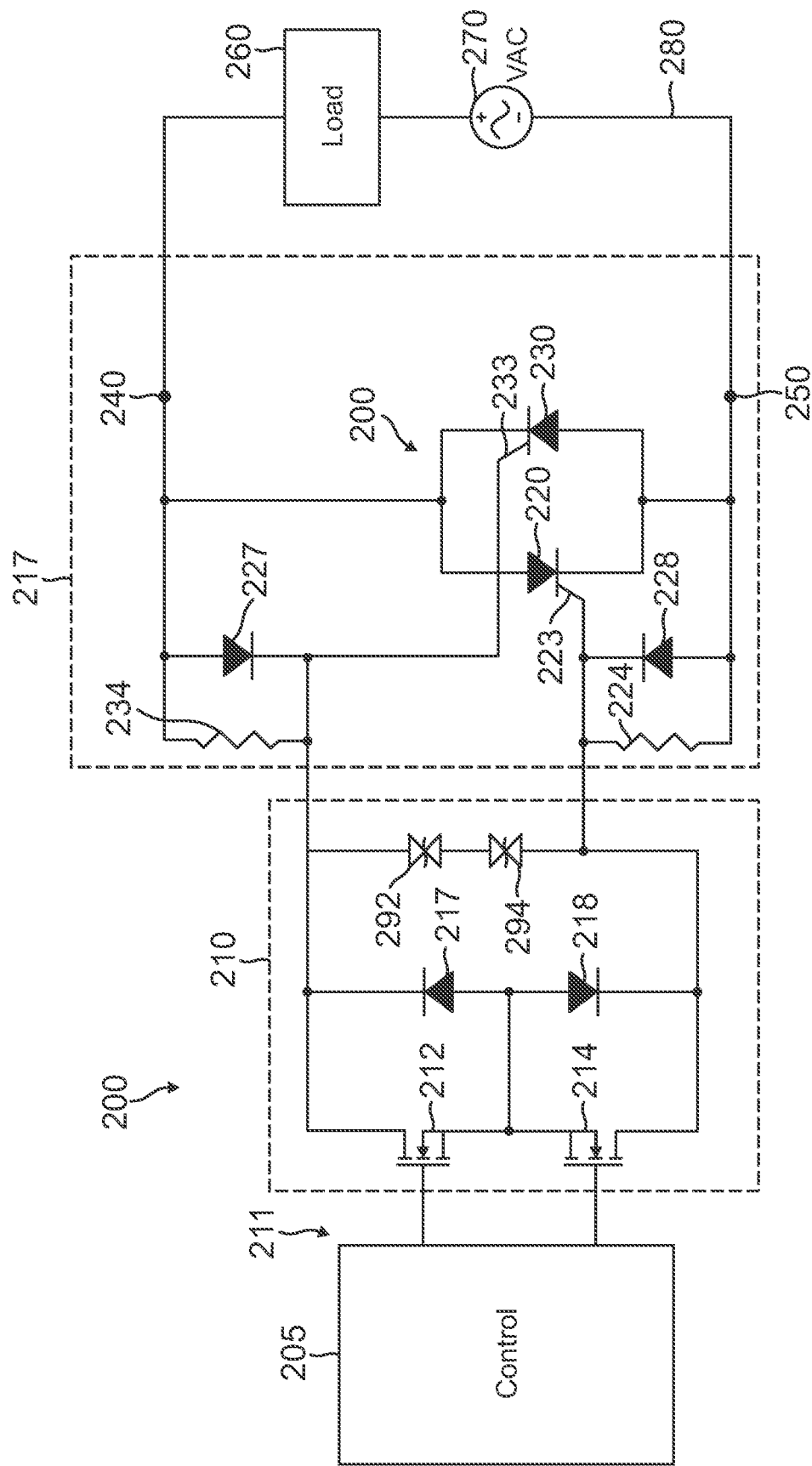
FIG. 2 shows a circuit diagram of an illustrative solid state switch that includes power transistors for controlling the output switching devices.
Figure 3:
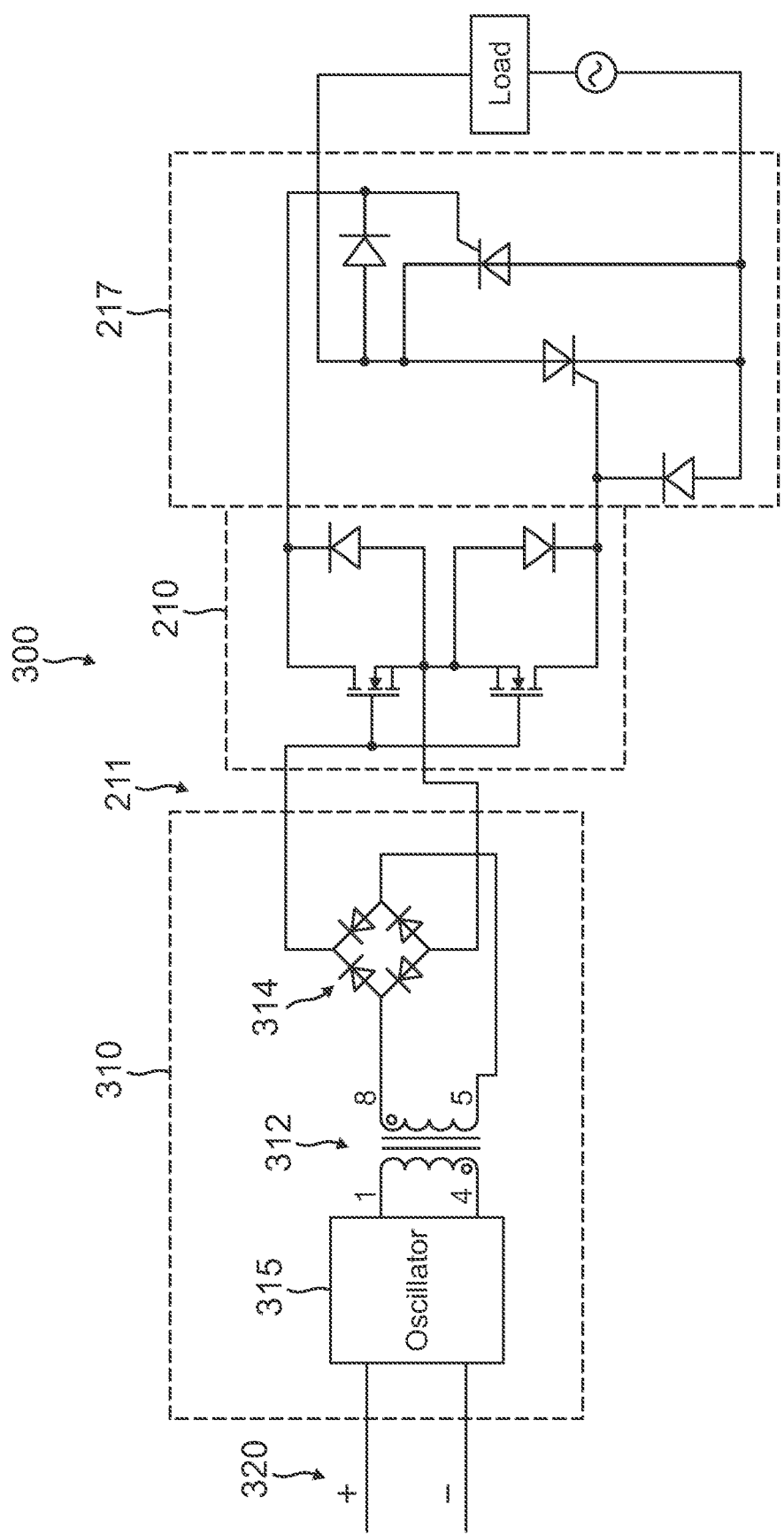
FIG. 3 shows a circuit diagram of an illustrative solid state switch that includes power transistors for controlling the output switching devices.

FIGS. 2 and 3 show block diagram of illustrative solid state switches (e.g., solid state relays 200 and 300, solid state contactors, etc.) that may include a plurality of semiconductor devices having a resistive effect on the circuit when active (e.g., power MOSFETs in a series opposition configuration) for controlling the switching of the silicon controlled rectifiers (SCRs) according to aspects of this disclosure. In the illustrative example of FIG. 2, the solid state relay 200 is similar to that of the solid state relay illustrated in FIG. 1, with a difference being that the optocouplers 112, 114 have been replaced with power MOSFET 212 and power MOSFET 214. In some cases, the power MOSFET 212 and the power MOSFET 214 are configured to be in a series opposition configuration. Further, in some cases, a further difference may be the use of diodes 227 and 228 that have been added in antiparallel with the gate to cathode of each SCR 220 and 230.

The solid state relay 200 may be controlled by a control circuit 205 that may be electrically connected to the solid state relay 200 via one or more input terminals 211. The control circuit 205 may be used to control the operation of the solid state relay 200 to cause a switch circuit 207 to enable a desired output (e.g., a desired voltage, a desired current, etc.) to be provided from a power source 270 to a load 260 via output terminals 240 and 250.

In an illustrative example, the solid state relay 200 may include a power MOSFET circuit 210 (e.g., the MOSFET 212, the MOSFET 214, the diode 217, the diode 218, etc.) that may be used to provide a control signal to the gates 223, 233 of the SCR 220 and the SCR 230. In some cases, one or more transient voltage suppressors (also known as a transient voltage suppression diode or a TVS) (e.g., TVS 292 and the TVS 294) may optionally be connected in parallel with the power MOSFETs 212 and 214, where TVS 292 and TVS 294 may be sized so that the power ratings of the MOSFETs 212 and 214 can be minimized. For example, a TVS may be used to absorb transient energy and may be sized to handle very large peak currents. By properly sizing and installing the TVS devices, the power rating requirement for the power MOSFETs 220 and 230 installed in the solid state relay 220 may be reduced. For example, an installed TVS may provide overvoltage protection for the power MOSFETs and/or other components of the solid state relay. In some cases, a MOSFET for use in a solid state relay 220 for a 480V application may be sized to have approximately 2 or 3 times the voltage rating, so that the MOSFETs chosen to be installed in the solid state relay 200 may have a voltage rating of about 1200 volts. However, with the additional overvoltage protection provided by the TVS devices 292 and 294, the MOSFETs may be chosen based on a lower voltage rating requirement (e.g., approximately 1000V). As such, costs associated with the chosen MOSFETs can be reduced. In many cases, the MOSFETs may be the most expensive components of the solid state relay 200. Thus, by minimizing the cost of the MOSFETs 212, 214, the costs of the solid state relay can be reduced as a whole.

As mentioned above, the power MOSFETs 212 and 214 and the anti-parallel diodes 217 and 218 are used in place of the optoisolator circuit 110 of FIG. 1. Further differentiating the solid state relay 200 of FIG. 2 from the solid state relay 100 of FIG. 1 is the addition of the low $V_f$ Schottky diodes 227 and 228 in antiparallel with the gate to cathode of each SCR 220 and 230. In this configuration, the output of the SCRs 220 and 230 are turned on by turning on the diodes 228 and 227 which, in turn, connects the gate of the forward biased SCR. Once the current reverses, the current flows with no interruption. Here, the load current may flow through the diode 227 when the forward voltage drop across resistor 234 reaches 0.1 volts. Current then may flow through diode 228 or diode 227, and the resistors 224 and 234 until the threshold voltage of the SCR gate to cathode is reached.

In an illustrative example, when operating in the saturation region, the resistance $R_{DS}$(on) of MOSFET 212 and MOSFET 214 may be about 4.5 Ohms, each, for a total of about 9 Ohms. With a current of approximately 20 mA, the voltage drop across the diode 227 or the diode 228, whichever is forward biased, of 0.1 volts, plus the voltage drop across the MOSFET 212 and the MOSFET 214, in series, thus the total voltage drop will sum to 0.3 volts, applied to the gate to cathode of the SCR 220 or the SCR 230, which is below a normal gate to cathode threshold voltage of the SCR 220 and the SCR 230, which is about 0.7 volts. As the load current through the triggering components (e.g., resistor 224 and diode 228 and resistor 234 and diode 227) nears the SCR 230 and SCR 220 gate to cathode voltage of approximately 0.7 volts, the load current begins to flow into the gate 233 of SCR 230. When the gate current flowing into the gate 233 reaches the current level for triggering the SCR 230, the SCR 230 turns on and load current is shared between the parallel path of the resistor 234 and diode 227 and the gate 233 of SCR 230. As such, no sudden change in load is encountered and, therefore, no high frequency conducted emissions are created. As the load current increases, the current through the triggering path of the SCRs remains approximately constant at an $I_{gt}$ level of the SCR 230, and the majority of the load current is also carried by the SCR 230. This uninterrupted turn on continues every half cycle until the gates of the power MOSFETS 212, 214 are turned off. In some cases, the resistors 234 and 224 may be used to ensure that the gates of the SCRs 230 and 220 are not floating and these resistors may, in some configurations, be optionally omitted.

In an illustrative example, the power MOSFETs 212 and 214 may be connected in series opposition and rated at the same voltage as the output SCRs. When enabled (e.g., a controlled to turn on), the power MOSFETs may be controlled to operate below a threshold voltage of the SCRs. In doing so, the conducted emissions may be reduced or eliminated. For example, tests have shown that for a 1 amp load, no conducted emissions were noticeable. In some cases, power MOSFETs may be used instead of the SCRs in the switching circuit, however SCRs and/or TRIACs are rugged components, which may be capable of handling inrush current, unlike high power MOSFETs. For example, the power MOSFETs cannot handle the loads generated by an incandescent lamp because the corresponding inrush current may damage the transistors. Unlike these MOSFETs, SCRs are more robust.

The solid state relay 200 and 300 may be used to control AC voltage outputs that may be in the range of about 400 volts to about 600 volts AC at 50 Hz or 60 Hz. For controlling voltages in this range at the output of the solid state relay 200, the power MOSFETS 212 and 214 may each have a voltage rating of at least 1200 volts. However, if the optional TVS overvoltage protection is enabled, as shown in the inclusion of TVS 292 and TVS 294, then the voltage rating of the power MOSFETS 212 and 214 may be rated at 1000 volts each, which may result in a significant cost savings. Further, by using the power MOSFETS 212 and 214 in the power MOSFET circuit 210, the conducted emissions introduced back on to the power lines may drop dramatically.

In some cases, the load 260 may correspond to one or more different applications, such as for example, a heater for a washing machine or an injection molding machine, a light being turned on and off, a motor turned on and off, a pump, and/or anything other device that may be considered to be an electrical load.

FIG. 3 shows an illustrative solid state relay 300 and a control circuit 310 that may be similar to the control circuit 205. In some cases, the control circuit may include one or more optoisolators that may be used to isolate the control circuitry from the higher power load voltages. In other cases, such as in FIG. 3, a transformer 312 may be used to electrically isolate the lower power control circuitry from the higher load-side voltages. In an illustrative example, an oscillator 315 may be enabled using one or more control lines 320 to provide an AC voltage source at a defined frequency. The alternating voltage output may be electrically coupled to the solid state relay control circuitry via the transformer 312. The AC voltage may then be rectified, such as by using the bridge rectifier 314 and may be used to provide the DC gate signals to the power MOSFETS (e.g., the MOSFETS 212 and 214) of the solid state relay 300. Other DC sources for the gating signals may be used. The control signal may be controlled based on a defined duty cycle.

The switching of a relay from a non-conducting to a conducting state occurs when the AC mains voltage reaches the zero-crossing point of the sine wave representing the AC voltage. It has been found that synchronizing a solid state relay with the zero-crossing of the AC main reduces the amount of conductive emissions in a solid state relay. More particularly, the surge current that travels through the load during the first conduction cycle is minimized, which reduces the conductive emissions.

FIG. 5A illustrates the operation of a solid state relay of the prior art. Time is plotted on X-axis 512. Voltage is plotted on Y-axis 510. As soon as point 530 occurs and the solid state relay has received the instruction to turn on, the solid state relay turns on immediately. This is indicated by the shaded portion 540 of FIG. 5A, where the shaded portion indicates the solid state relay being turned on. As explained above, when a solid state relay turns on at a non-zero point, RF emission is at a maximum.

Figure 4:
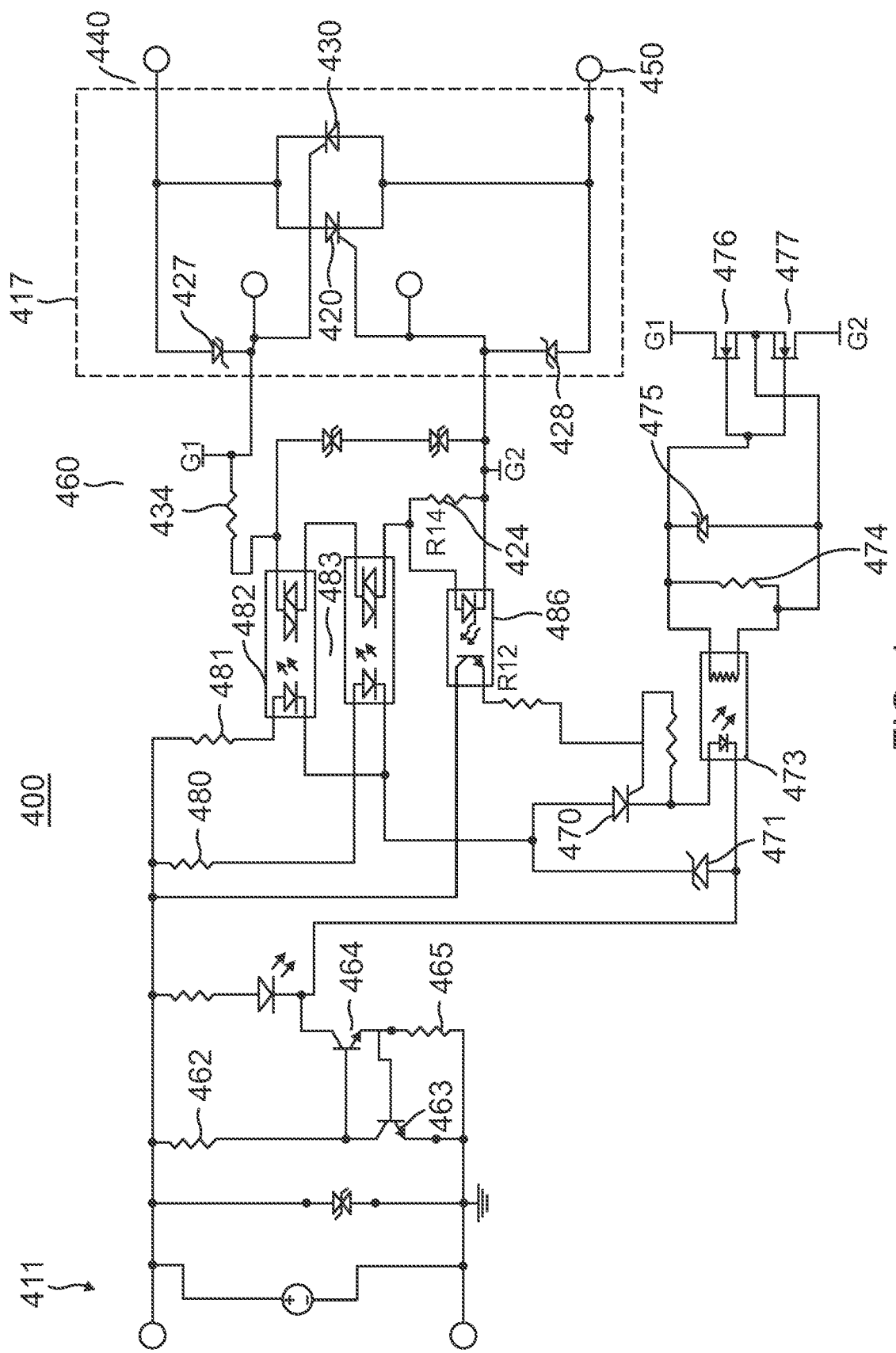
FIG. 4 shows a circuit diagram of an illustrative solid state switch that includes zero crossing sensing features according to aspects of the disclosure.

FIG. 5B illustrates the operation of solid state relay 400 of FIG. 4. When point 530 occurs and the solid state relay has received the instruction to turn on, the solid state relay does not turn on immediately. Instead, as illustrated by shaded portion 560, solid state relay does not turn on until signal 520 reaches a zero-crossing point. As such, RF emission is minimized.

With reference to FIG. 4, an illustrative solid state relay 400 featuring zero-crossing functionality is presented. In a manner similar to that presented in FIGS. 1-3, a control circuit 405 is electrically coupled to the solid state relay 400 via one or more input terminals 411.

An output switch circuit 417 operates in a manner similar to that of output switch circuit 117 of FIG. 1. The semiconductor switches of output switch circuit 417 (e.g., SCR 420 and SCR 430) may be triggered into a conduction state by a current flowing through Zener diode 427 and/or Zener diode 428. In this configuration, the output of SCRs 420 and 430 are turned on by turning on the Zener diodes 427 and 428 which, in turn, connects the gate of whichever of SCR 420 or 430 is forward biased. Once the current reverses, the current flows with no interruption. Here, the load current may flow through the diode 427 when the forward voltage drop across resistor 434 reaches 0.1 volts. Current then may flow through diode 427 or diode 428, and the resistors 424 and 434 until the threshold voltage of the SCR gate to cathode is reached. The outputs of output switch circuit 417 can be accessed at output terminals 440 and 450. Output terminals 440 and 450 can be used to enable a desired output to be provided from a power source to a load via output terminals 440 and 450. While silicon controlled rectifiers are illustrated as the semiconductor switches, it should be understood that other types of semiconductor switches, such as gate turn-off thyristors (GTOs), triodes for alternating current (TRIACs), insulated gate bipolar transistors (IGBTs), and/or the like, can be used instead.

Circuit 460 serves as a zero crossing driver circuit. Resistor 462, transistor 463, transistor 464, and resistor 465 serve as a current regulator of the zero crossing driver circuit. Also present in circuit 460 is a low emission driver circuit. The low emission driver circuit serves to lower the emission of the solid state relay 400 during normal operation. However, the low emission driver circuit does not prevent emissions during a turn-on portion (as illustrated with reference to FIGS. 5A and 5B).

Zero-crossing functionality is provided by the remaining elements of the circuit. Resistors 480 and 481 serve to create a voltage drop for use by opto-couplers 482 and 483. Opto-couplers 482 and 483 have integrated zero-crossing detectors. The activation of one of opto-coupler 482 or 483 causes current to flow through resistor 434 and Zener diode 427 and operate as described above.

Because of the zero-crossing functionality, opto-couplers 482 and 483 are only activated during the first cycle of the input signal being turned on. Subsequent cycles are handled by the low emission driver described above. This is accomplished through the use of opto-coupler 486. The activation of silicon controlled rectifiers 420 and 430 is sensed by opto-coupler 486. Opto-coupler 486 sends a signal to silicon controlled rectifier 470 is used to turn on the low emission driver. Silicon controlled rectifier 470 is in parallel with Zener diode 471. When silicon controlled rectifier 470 is on, the voltage drop is lower than that of Zener diode 471, thus disabling Zener diode 471. Current then flows to opto-coupler 473. Opto-coupler 473 is coupled to the low emission driver comprising resistor 474, Zener diode 475, transistor 476, and transistor 477. The low emission driver operates to ensure a lowered amount of RF emissions after the zero-crossing circuit has operated for the first cycle.

Figure 6:
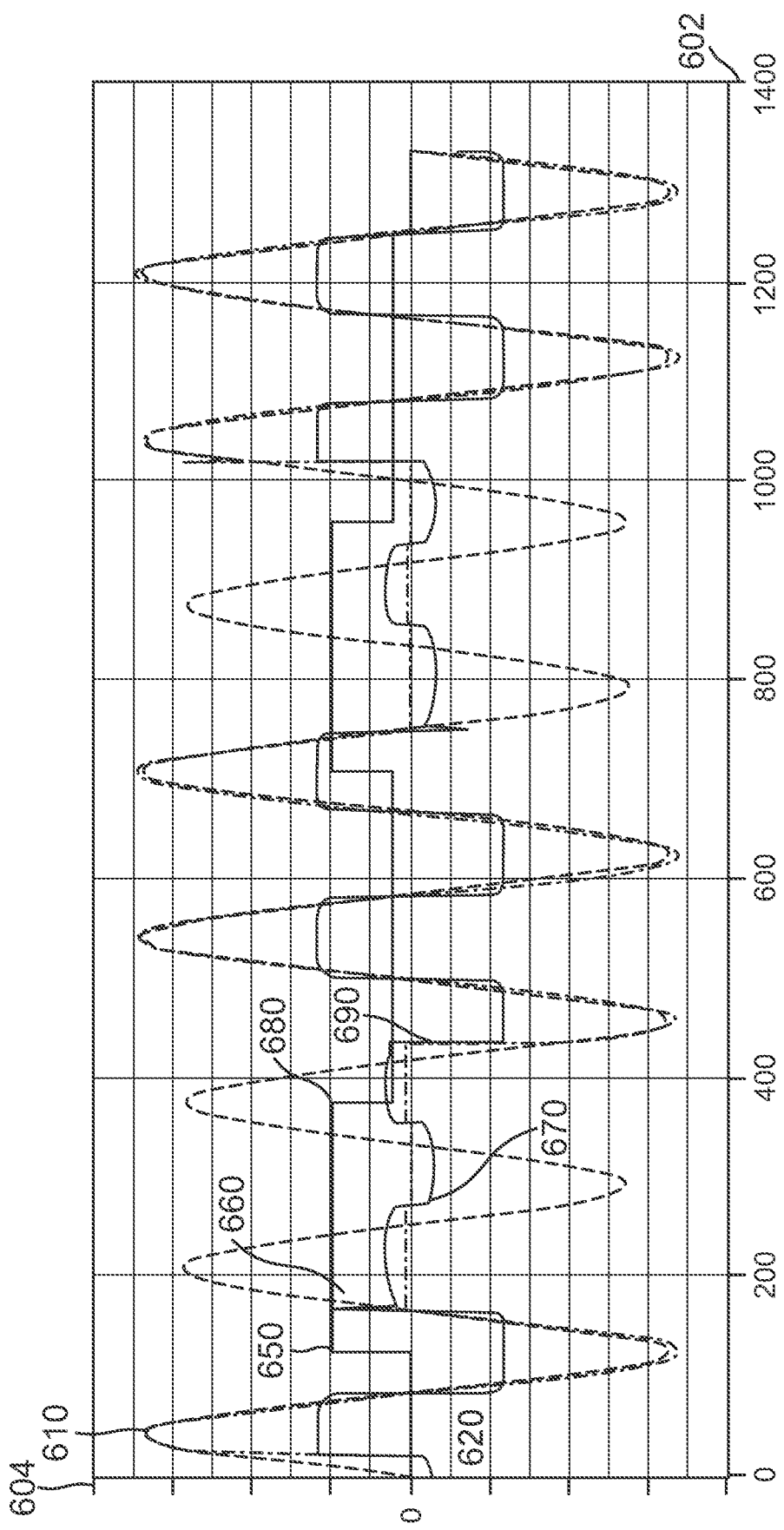
FIG. 6 depicts a graph illustrating the timing of a turn on of a solid state switch illustrating the operating of zero crossing sensing features according to aspects of the disclosure.

With reference to FIG. 6, a graph illustrating the operation of an illustrative solid state relay is presented. X-axis 602 represents time while Y-axis 604 represents voltage. At point 650, a control signal 620 is applied to the input. The AC line polarity is shown at voltage 610. At point 650, voltage 610 is still negative. At point 660, voltage 610 crosses zero voltage by going from a negative value to a positive value. By point 670, when voltage 610 crosses zero voltage again by going from a positive value to a negative value, the low emission driver has been turned on by opto-coupler 486 and silicon controlled rectifier 470. When control signal 620 is turned off at point 680, the output turns off by point 690.

The advantages, and other features of the systems and methods disclosed herein, will become more readily apparent to those having ordinary skill in the art from the following detailed description of certain preferred embodiments taken in conjunction with the drawings which set forth representative embodiments of the present invention. Like reference numerals are used herein to denote like parts. Further, words defining orientation such as "upper", and "lower" are merely used to help describe the location of components with respect to one another. For example, an "upper" surface of a part is merely meant to describe a surface that is separate from the "lower" surface of that same part. No words denoting orientation are used to describe an absolute orientation (i.e., where an "upper" part must always be on top).

It will be appreciated by those of ordinary skill in the pertinent art that the functions of several elements may, in alternative embodiments, be carried out by fewer elements or a single element. Similarly, in some embodiments, any functional element may perform fewer, or different, operations than those described with respect to the illustrated embodiment. Also, functional elements shown as distinct for purposes of illustration may be incorporated within other functional elements in a particular implementation.

While the subject technology has been described with respect to preferred embodiments, those skilled in the art will readily appreciate that various changes and/or modifications can be made to the subject technology without departing from the spirit or scope of the subject technology. For example, each claim may be dependent from any or all claims in a multiple dependent manner even though such has not been originally claimed.

What is claimed is:

1. A solid state switch comprising:
    an output circuit comprising a first plurality of semiconductor switching devices including a plurality of silicon controlled rectifiers, wherein the first plurality of semiconductor switching devices selectively provide power to a load from a voltage source when enabled; and
    an input circuit comprising a second plurality of semiconductor switching devices, wherein each of the second plurality of semiconductor switching devices is electrically coupled to a gate of a corresponding semiconductor switching device of the first plurality of semiconductor switching devices; and
    wherein the second plurality of semiconductor switching devices comprise a plurality of optocoupler devices with zero crossing detection functionality;
    wherein the second plurality of semiconductor switching devices are configured to turn on the output circuit upon the zero crossing of a control signal applied to the second plurality of semiconductor switching devices.

2. The solid state switch of claim 1, wherein the solid state switch comprises a solid state relay.

3. The solid state switch of claim 1, further comprising a low emission driver circuit configured to lower electromagnetic conducting emissions of the output circuit.

4. The solid state switch of claim 3, wherein the low emission driver is configured to operate when the second plurality of semiconductor switching devices is turned off.

5. The solid state switch of claim 4, wherein the low emission driver is coupled to the second plurality of semiconductor switches via a third optocoupler to turn off the second plurality of semiconductor switching devices when the low emission driver is turned on.

6. The solid state switch of claim 5, wherein the third optocoupler is coupled to a silicon controlled resistor in parallel with a Zener diode to turn off the second plurality of semiconductor switching devices and turn on the low emission driver.

7. The solid state switch of claim 4, wherein the low emission driver is configured to turn on after a second zero crossing of the control signal.

8. The solid state switch of claim 1, wherein the first plurality of semiconductor switching devices is coupled to the second plurality of semiconductor switching devices via a Zener diode.

9. The solid state switch of claim 1, wherein the first plurality of semiconductor switching devices comprise a plurality of triodes or triodes for alternating current (TRIAC).

10. The solid state switch of claim 1, further comprising a current regulator coupled to the second plurality of semiconductor switching devices.

11. The solid state switch of claim 1, wherein the first plurality of semiconductor switching devices comprises a plurality of silicon controlled rectifiers.

12. A solid state switch comprising:
- an output circuit comprising a first plurality of semiconductor switching devices, wherein the first plurality of semiconductor switching devices selectively provide power to a load from a voltage source when enabled; and
- an input circuit comprising a second plurality of semiconductor switching devices, wherein each of the second plurality of semiconductor switching devices is electrically coupled to a gate of a corresponding semiconductor switching device of the first plurality of semiconductor switching devices; and
- wherein the second plurality of semiconductor switching devices comprise a plurality of optocoupler devices with zero crossing detection functionality;
- wherein the second plurality of semiconductor switching devices are configured to turn on the output circuit upon the zero crossing of a control signal applied to the second plurality of semiconductor switching devices; and
- wherein the first plurality of semiconductor devices is coupled to the second plurality of semiconductor switching devices via a Zener diode.

* * * * *